United States Patent
Tanaka (10) Patent No.: US 7,381,887 B2
(45) Date of Patent: Jun. 3, 2008

(54) SOLAR CELL AND METHOD AND APPARATUS FOR MANUFACTURING SOLAR CELL

(75) Inventor: Satoshi Tanaka, Yamatotakada (JP)

(73) Assignee: Sharp Kabushiki Kaisha, Osaka (JP)

( * ) Notice: Subject to any disclaimer, the term of this patent is extended or adjusted under 35 U.S.C. 154(b) by 505 days.

(21) Appl. No.: 10/335,954

(22) Filed: Jan. 3, 2003

(65) Prior Publication Data

US 2003/0136441 A1 Jul. 24, 2003

(30) Foreign Application Priority Data

Jan. 22, 2002 (JP) .............................. 2002-013226

(51) Int. Cl.
*H01L 31/0224* (2006.01)
(52) U.S. Cl. ...................... 136/256; 136/261
(58) Field of Classification Search ......... 136/243–265
See application file for complete search history.

(56) References Cited

U.S. PATENT DOCUMENTS 5,641,362 A * 6/1997 Meier .......................... 136/256
6,586,270 B2 * 7/2003 Tsuzuki et al. ................ 438/57

FOREIGN PATENT DOCUMENTS

| JP | 5-110122 | 4/1993 |
| JP | 8-97448 A | 4/1996 |
| JP | 2000-133826 A | 5/2000 |
| JP | 2005-191107 A | 7/2005 |

* cited by examiner

*Primary Examiner*—Nam Nguyen
*Assistant Examiner*—Jeffrey Barton
(74) *Attorney, Agent, or Firm*—Nixon & Vanderhye, P.C.

(57) ABSTRACT

A thin solar cell is provided, a decreased amount of an Al paste used for the solar cell without occurrence of a problem of ball-up which is a defect in appearance. A method of manufacturing such a solar cell as well as a manufacturing apparatus used therefor are provided. This manufacturing method is applicable with substantially no change in the conventional material and process. The solar cell has an Al paste electrode on the back surface and at least a part of an outer edge of the Al paste is thicker than any remaining part.

8 Claims, 7 Drawing Sheets

SOLAR CELL AND METHOD AND APPARATUS FOR MANUFACTURING SOLAR CELL

BACKGROUND OF THE INVENTION

1. Field of the Invention

The present invention relates to solar cells, particularly a solar cell with its back surface having a paste electrode of Al thereon, and relates to methods and apparatuses for manufacturing the solar cell.

2. Description of the Background Art

Figure 9:
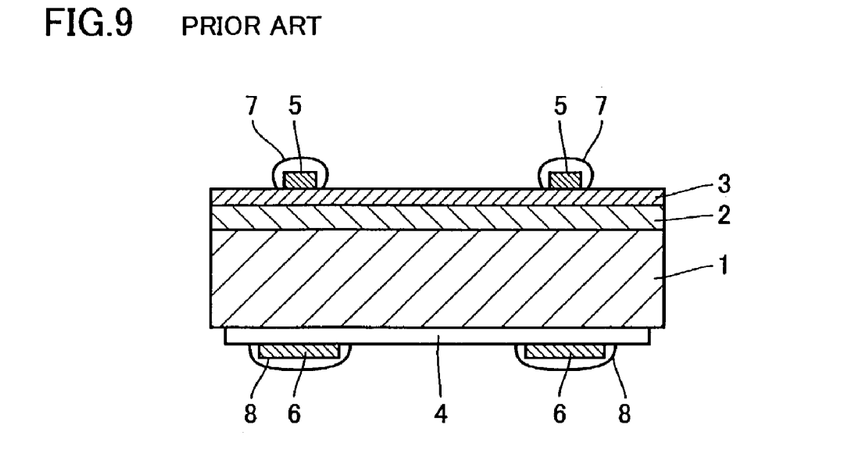
FIG. 9 is a cross sectional view showing a structure of a solar cell having an Al paste electrode formed on the back surface thereof.
Figure 10:
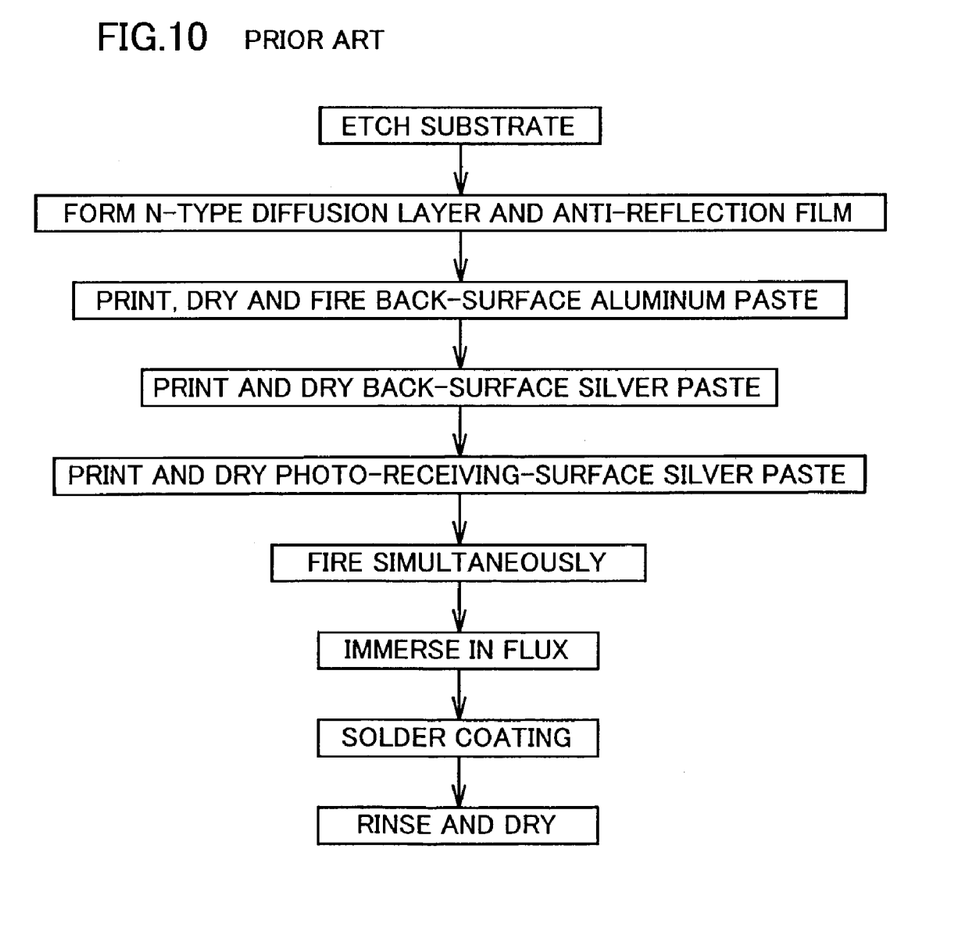
FIG. 10 is a flowchart illustrating a process of manufacturing the solar cell having the Al paste electrode formed on the back surface thereof

FIG. 9 shows a structure of a solar cell with its back surface provided with a paste electrode made of Al. The structure of the solar cell is hereinafter described in connection with a manufacturing process shown in FIG. 10. For a crystalline silicon-based cell, after a p-type silicon substrate 1 is etched, an n-type diffusion layer 2 is deposited on one side of the substrate that serves as a photo-receiving plane and an anti-reflection film 3 is formed thereon in order to decrease the surface reflectance. On the other side of the substrate that is opposite to the photo-receiving plane (the above-mentioned other side is herein referred to as "back surface" as appropriate), a paste of Al is screen-printed, dried at approximately 150° C. and thereafter fired in the air at approximately 700° C. to form a paste electrode 4 of Al. Moreover, a silver paste is screen-printed on some parts of the back surface and the photo-receiving plane according to a pattern, dried and thereafter fired in an oxidizing atmosphere at a high temperature to form paste electrodes 5 and 6 of silver. The resultant device is immersed in a flux, silver paste electrodes 5 and 6 are then solder-coated, and the device is rinsed and dried to produce the solar cell. The solar cell generally has a size of, for example, 10 cm, 12.5 cm or 15.5 cm per side.

In the screen-printing process, a cell to be subjected to printing is fixed on a stage, and a screen mask is lowered to adjust the distance between the cell and the screen mask to an appropriate one. The Al paste is supplied onto the screen mask and a squeegee is moved while pressurizing the paste so as to transfer the Al paste onto the cell through the screen mask.

Figure 11A:
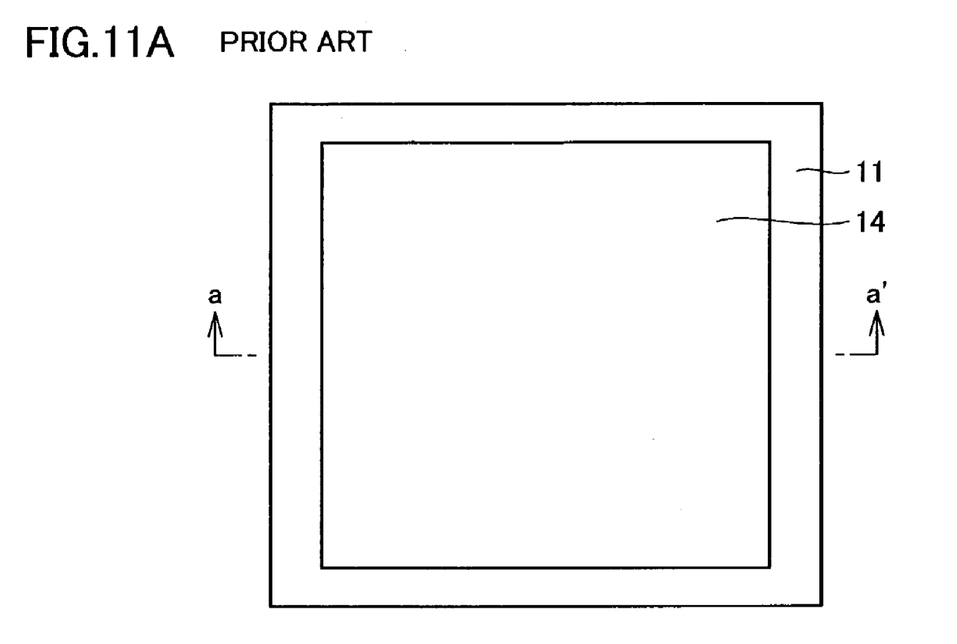
FIG. 11A is a plan view of a p-type silicon substrate having an Al paste electrode formed thereon and FIG. 11B is a cross sectional view along line a-a in FIG. 11A.
Figure 11B:
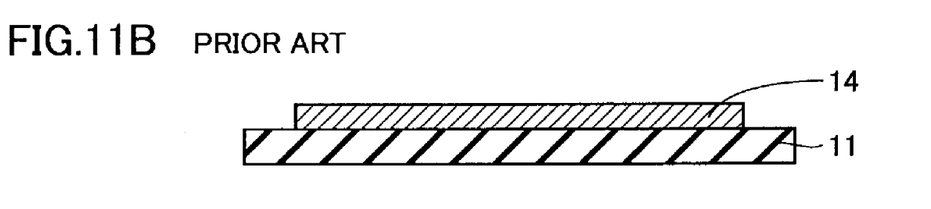

FIG. 11A is a plan view of a p-type silicon substrate 11 showing an Al paste electrode 14 formed on the back surface of the substrate. FIG. 11B shows a cross section of the substrate along line a-a in FIG. 11A. The thickness of the Al paste which has been dried is 45 to 55 μm, the average thickness being approximately 50 μm.

In order to manufacture solar cells excellent in long-term reliability at low cost, there has recently emerged a need for decrease of the amount of the Al paste used in the process that constitutes a considerable part of a solar cell. In addition, as it is known that decrease of the thickness of the Al paste electrode is effective for lessening any warp of the solar cell and, in this sense, it is urgently required to decrease the amount of the Al paste.

Figure 12:
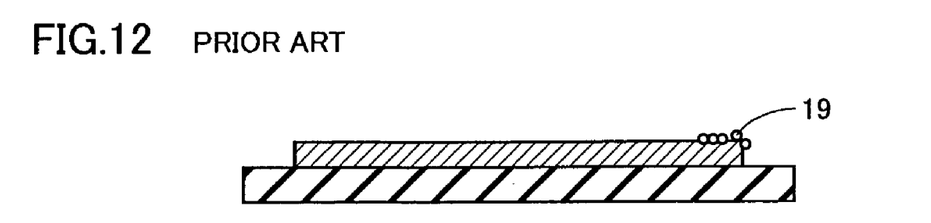
FIG. 12 is a cross sectional view of a p-type silicon substrate with an Al paste electrode formed thereon where the trouble of ball-up occurs.

The decrease of the amount of the Al paste and the decrease of the thickness after drying to 40 μm or less for example, are unsatisfactory for the following reason. Referring to FIG. 12, after the Al paste is fired, ball-shaped Al particles 19 of a diameter ranging from several tens of μm to several hundred μm are generated on the outer edge of the electrode. This trouble (called "ball-up") causes a problem that the cell cannot be commercialized due to the defect in appearance.

SUMMARY OF THE INVENTION

One object of the present invention is to provide a thin solar cell produced with a decreased amount of an Al paste, without the trouble of ball-up. Another object of the present invention is to provide a method of manufacturing such a solar cell as discussed above as well as an apparatus used therefor.

A solar cell has an Al paste electrode on its back surface, and at least a part of an outer edge of the Al paste electrode has a greater thickness than that of any remaining part of the Al paste electrode. Preferably, only one side, only two sides opposite to each other, or only two sides adjacent to each other, of the outer edge of the Al paste electrode is/are thicker than any remaining part of the Al paste electrode. It is also preferable that the thickness of the Al paste electrode successively changes.

According to a method of manufacturing a solar cell, screen printing is performed by pressurizing an Al paste through a screen mask to transfer the Al paste to the back surface of the solar cell. The distance between the screen mask and the back surface of the solar cell in the screen printing is changed depending on a part of the back surface that is to be printed, and a part more distant from the screen mask is printed with a thicker Al paste while a part less distant from the screen mask is printed with a thinner Al paste.

The distance between the screen mask and the back surface of the solar cell may be changed by providing a spacer to at least a part of a space between a frame of the screen mask and a mask holder, by providing a spacer to at least a part of a region to be screen-printed that is located along and outside the perimeter of the solar cell, by providing a spacer to at least a part between the solar cell and a stage for securing the solar cell thereon, or by inclining the stage for securing the solar cell thereon.

Accordingly, the solar cell may be manufactured by a screen printer having a stage for securing the solar cell thereon that is inclined to change the distance between the screen mask and the back surface of the solar cell. The solar cell may also be manufactured by moving a squeegee faster above a part of the back surface of the solar cell that is to be printed with a thicker Al paste. Moreover, the solar cell of the present invention may be manufactured by performing printing of the Al paste at least once before, after or before and after the screen printing for a part of the back surface of the solar cell that is to be applied with a thicker Al paste.

Further, the solar cell may be manufactured by performing spray coating of the Al paste at least once before, after or before and after the screen printing for a part of the back surface of the solar cell that is to be applied with a thicker Al paste. The solar cell may be manufactured by using a screen mask having a pressed part used for applying a thinner Al paste. The manufacturing apparatus thus includes the screen mask with a pressed part for applying a thinner Al paste.

A solar cell may be manufactured by using a screen mask with the distance between an edge of a pattern of the screen mask and a frame of the screen mask that is closest to the edge being at most 30 mm, preferably at most 20 mm. The manufacturing apparatus thus includes the screen mask with the distance from the frame being at most 30 mm, preferably 20 mm.

The solar cell may be manufactured by using a squeegee applying printing pressure which is changed depending on a part to be printed, and accordingly a thicker Al paste is formed on a part applied with a lower printing pressure relative to a part applied with a higher printing pressure. The manufacturing apparatus includes a squeegee applying a decreased printing pressure by a part of an edge of the squeegee which is shorter than a remaining part of the edge of the squeegee. Further, the manufacturing apparatus includes a squeegee having a part of an edge and another part thereof that are attached at respective angles different from each other to apply a lower printing pressure by the part of the edge than that applied by that another part.

A thin solar cell can be provided that uses a decreased amount of an Al paste without being accompanied by a problem of ball-up which is a defect in appearance, as well as a method of manufacturing the solar cell and an apparatus used therefor. Moreover, the solar cell can be produced without substantially changing the conventional materials and process. In addition, the solar cell is effective in that the cell cracks less frequently since the outer edge of the aluminum electrode has an increased thickness.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

<Solar Cell>

The present invention has a characteristic that, at least a part of an outer edge of an Al paste electrode formed on the back surface of a solar cell has a greater thickness than that of any remaining part of the electrode.

The outer edge of the Al paste electrode has a thickness which is made greater than that of any remaining part, since the ball-up tends to occur on the outer edge of the Al paste electrode and the increased thickness of the electrode makes the ball-up less prone to occur. Specifically, the ball-up is less prone to occur when the thickness of the electrode is at least 45 µm, while the ball-up is more prone to occur when the thickness is 40 µm or less. In view of this, even if the Al paste electrode has a thickness of 40 µm or less in order to reduce the amount of the Al paste used for forming the Al paste electrode, the thickness of the outer edge of the electrode is preferably at least 45 µm for preventing the ball-up and the thickness is more preferably at least 55 µm.

A reason for increasing the thickness of at least a part of the outer edge of the Al paste electrode is that, the ball-up does not uniformly occur on the electrode. In other words, the probability of occurrence of the ball-up is higher on a side of the electrode that enters a firing furnace first, while the probability thereof is lower on a side of the electrode that enters the firing furnace last. Moreover, in consideration of the challenge to decrease the amount of Al paste to be used, any part where the ball-up tends to occur is preferably made thicker.

Figure 1A:
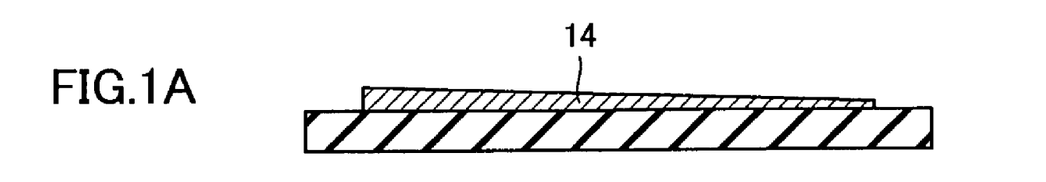
FIGS. 1A to 1E each show a cross sectional view of a solar cell according to an example embodiment.
Figure 1B:
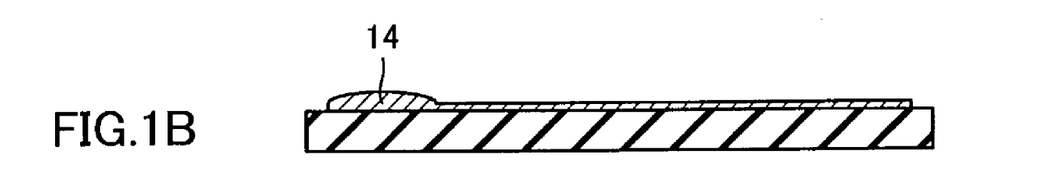
Figure 1C:
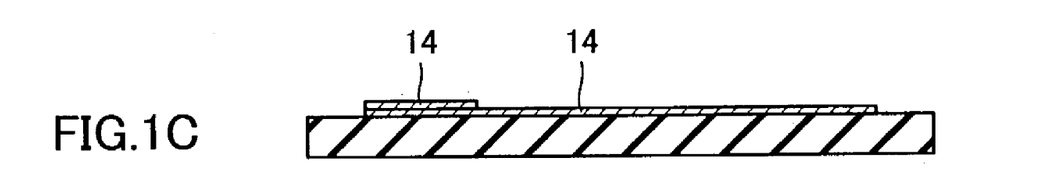
Figure 1D:
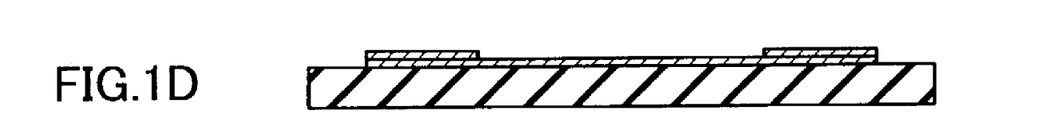
Figure 1E:
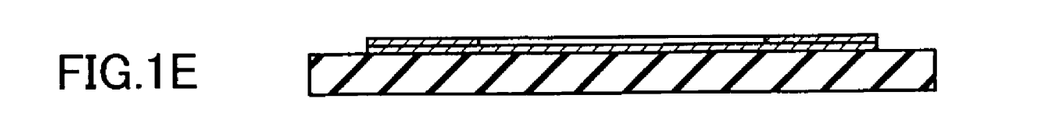

Specifically, as shown in FIGS. 1A to 1C, only one side of the outer edge of an Al paste electrode 14 that is put into a firing furnace first is preferably larger in thickness. In this case, preferably the thickness is gradually varied as shown in FIG. 1A according to any method of varying the thickness of the printed electrode for example. Alternatively, only two sides including the side entering the furnace last are preferably made thicker as shown in FIG. 1D. Further, as the probability of occurrence of the ball-up is higher on the outer edge of the Al paste electrode while the ball-up rarely occurs on the central part of the electrode, all of the four sides constituting the outer edge of the electrode are made thick as shown in FIG. 1E. It is to be noted here that the electrode is not always put into the furnace in the direction perpendicular to opposite two sides of the electrode, or the electrode may be polygonal in shape. In these cases, preferably only two sides adjacent to each other of the outer edge of the Al paste electrode are made thick (not shown).

<Manufacturing Method>

The solar cell of an example embodiment has the characteristic that the outer edge of the Al paste electrode is relatively thick. The thickness of the electrode may be varied from part to part of the electrode by, for example, changing the distance between the screen mask and the back surface of the solar cell, changing any conditions of the printing speed or pressure for example, changing the number of times the printing is done, changing the specification of the screen mask, or changing the specification of the squeegee.

One example method of manufacturing a solar cell has a characteristic that, the distance between the screen mask and the back surface of the solar cell undergoing screen printing is varied according to a part of the electrode to be printed so that a part of the electrode at a relatively long distance from the screen mask has a thicker Al paste printed thereon while a part at a relatively short distance therefrom has a thinner Al paste printed thereon. When there is a longer distance between the screen mask and the back surface of the solar cell, a greater amount of an Al paste is allowed to pass through the screen mask and thus a greater amount of the Al paste can be transferred onto the back surface of the solar cell to print the Al paste of a greater thickness. The relation between the distance from the screen mask to the back surface of the solar cell and the thickness of the Al paste varies depending on the viscosity, for example, of the Al paste to be used. If an Al paste may be printed to have a thickness of approximately 40 µm with the distance of 0.3 to 0.6 mm between the screen mask and the back surface of the solar cell, the thickness of approximately 45 µm of the paste is achieved by providing a distance of 1.5 to 2.0 mm between the screen mask and the back surface of the solar cell.

Figure 2:
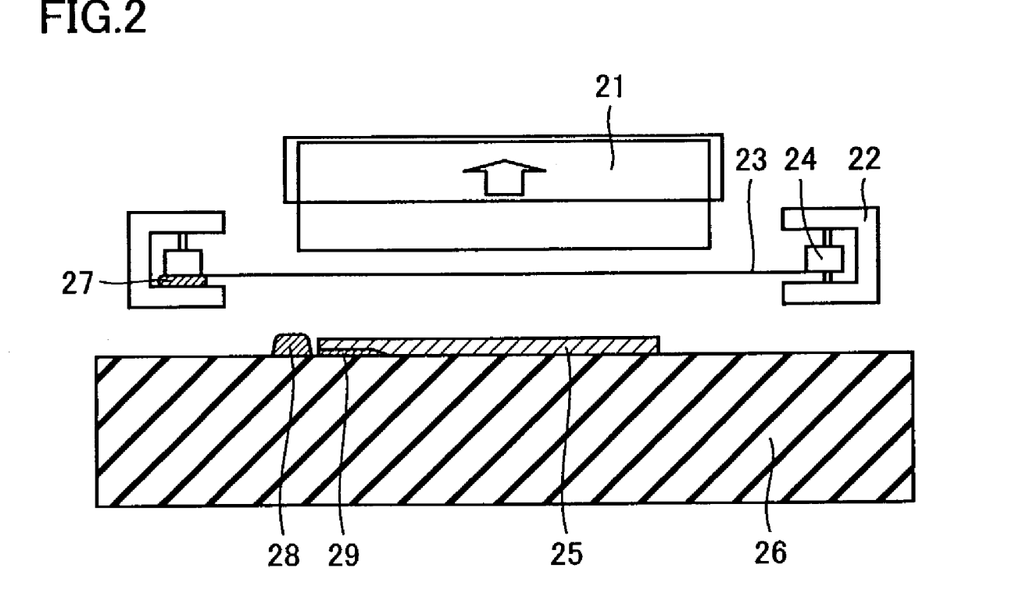
FIGS. 2 to 4 each show a cross sectional view of a screen printer.

Preferred methods of varying the distance between the screen mask and the back surface of the solar cell according to a part to be printed are now described. Referring to FIG.

2, a spacer 27 may be provided between a frame 24 of a screen mask 23 and a mask holder 22, a spacer 28 may be provided to at least a part of the perimeter of a region of a cell 25 (hereinafter referred to as "solar cell" as appropriate) that is to be screen-printed, a spacer 29 may be inserted into at least a part of the region between a stage 26 holding cell 25 and cell 25, or stage 26 holding cell 25 may be inclined. Any of the above-discussed methods allows the screen mask 23 which is moved down for printing to be inclined with respect to the back surface of the solar cell, and thus the distance between the back surface of the solar cell and the screen mask is varied according to a part to be printed.

Figure 3:
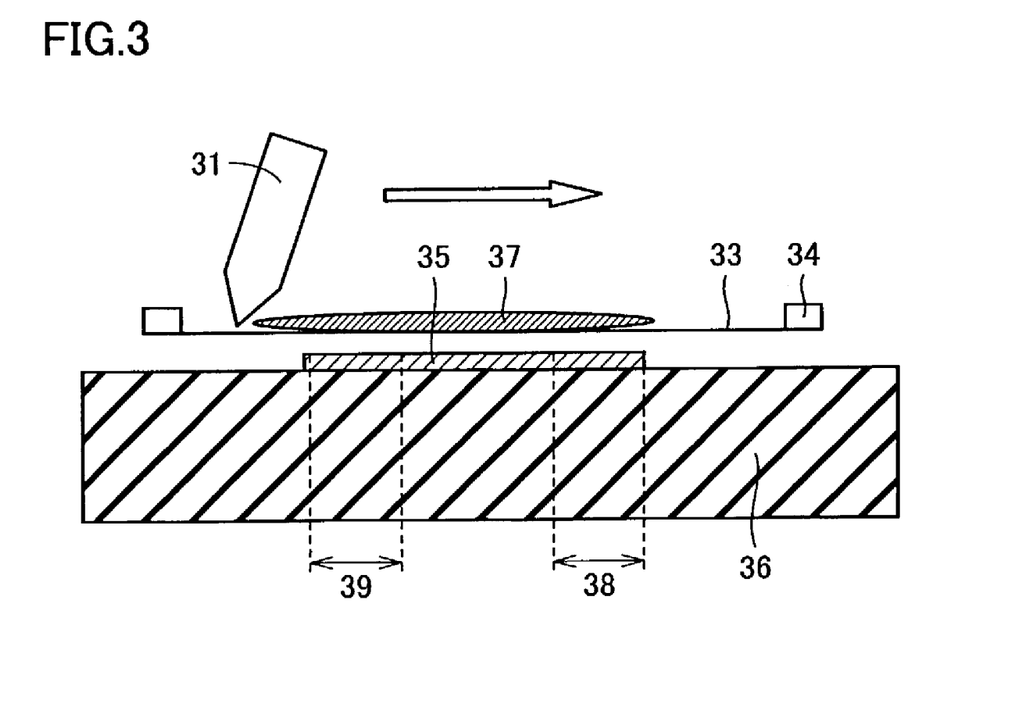

Another example method of manufacturing a solar cell as shown in FIG. 3 has a characteristic that a squeegee 31 is speedily moved above a part 38 where an Al paste is to be printed to a greater thickness in screen-printing. The squeegee is moved faster and accordingly, the screen mask separates more speedily from the back surface of the solar cell as the squeegee passes. Then, a greater amount of an Al paste is passed through the screen mask and transferred onto the back surface of the solar cell and the part is printed with a thicker paste relative to any part above which the squeegee moves slower. The squeegee moves at a speed which is different depending on the specification, for example, of a screen printer. If the squeegee can be moved at a speed of 30 to 50 mm/sec to print an Al paste to a thickness of approximately 40 μm, a thickness of approximately 45 μm is achieved by moving the squeegee at a higher speed of 120 to 200 mm/sec.

Figure 4:
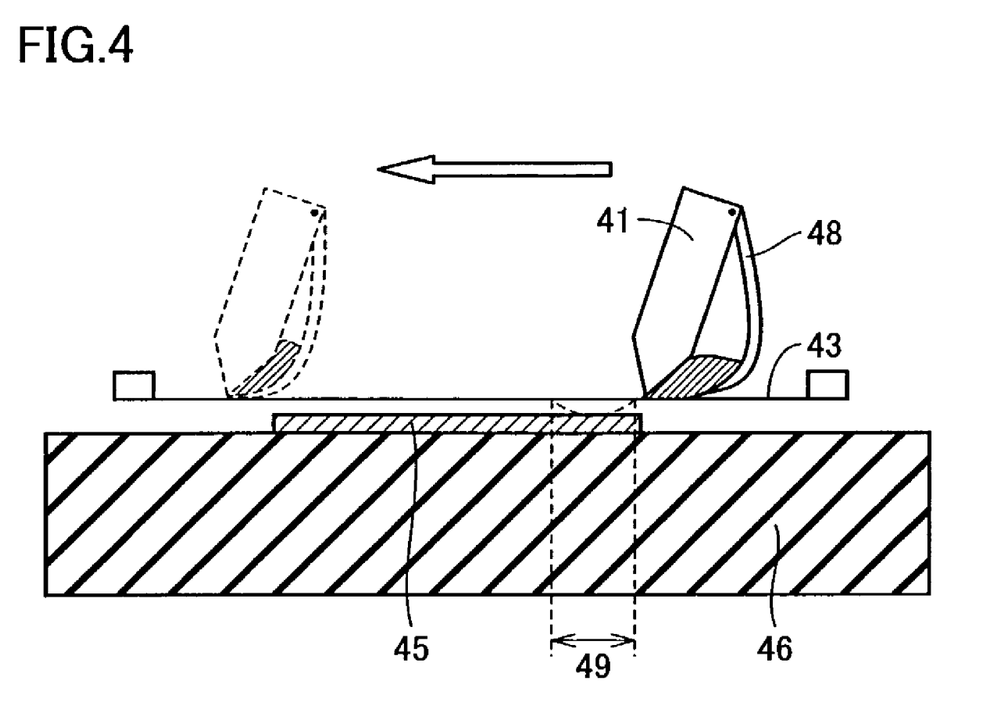

Still another example method of manufacturing a solar cell has a characteristic that, any part to be printed with a thicker Al paste is subjected to at least one printing operation of the Al paste before, after, or before and after screen printing. The same part is printed a plurality of times to generate a thicker printed paste relative to other parts. One example of this method is shown in FIG. 4, according to which a printer is controlled as follows. After screen printing and before returning of a squeegee 41 with a scraper (ink turner) 48 provided thereon, a new cell 45 is fixed on a stage 46 and, in the course of returning of squeegee 41 and scraper 48 back to the original position, scraper 48 is lowered onto a part 49 to be printed with a thicker paste to pressurize a screen mask 43. By this method, pre-printing can be performed by scraper 48 before screen printing by squeegee 41, which is preferable in that the pre-printing is performed with easy manipulation after the screen printing. Scraper 48 may be lowered by 1.0 mm or less to print an Al paste of 5 to 20 μm in thickness, which may be different depending on the specification of the Al paste. In addition, the Al paste used for the first printing can be used for the second and subsequent printing operations. If an Al paste contains a glass component, an Al paste of a different kind may be used.

A further example method of manufacturing a solar cell has a characteristic that, a part where a thicker Al paste is to be printed undergoes at least one spray-coating of an Al paste before, after, or before and after screen printing. The spray coating allows that part to be printed with a thicker paste relative to other parts. Although another coating method except for the spray coating may be employed, the spray coating is a simplest one and thus preferable. When the spray coating is made, such an organic solvent as n-butyl carbitol acetate is preferably added to the Al paste for decreasing the viscosity of the paste relative to the viscosity for the screen printing. Moreover, the Al paste used for the first printing can be used for the second and subsequent printing operations. If an Al paste contains a glass component, an Al paste of a different kind may be used.

Figure 5:
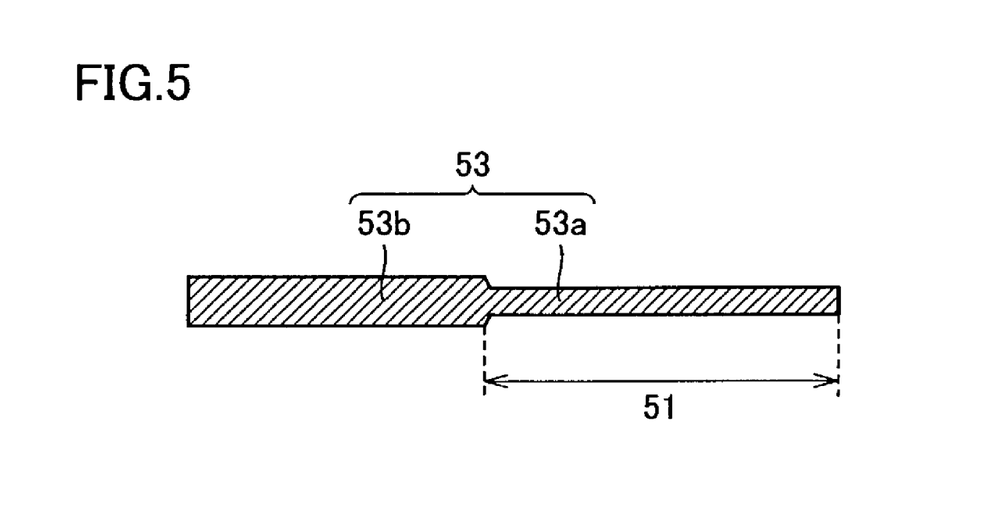
FIG. 5 is a cross sectional view of a screen mask.

The solar cell of an example embodiment may be manufactured by a screen mask as shown in FIG. 5. Specifically, screen mask 53 has a pressed section 53a corresponding to a part 51 for printing a thin Al paste. The pressed section 53a is thinner than a non-pressed screen mask section 53b. Accordingly, the pressed section of the increased density passes less Al paste, resulting in a thinner Al paste in screen printing. Regarding the pressing work, calendar roll may be used for pressurizing.

Figure 6:
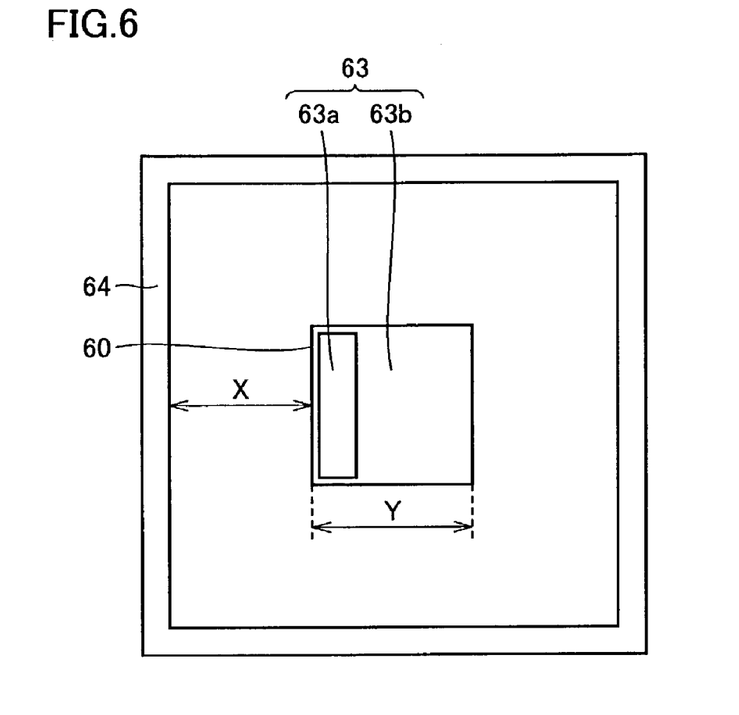
FIG. 6 is a plan view of a screen mask.

A further example method of manufacturing a solar cell has a characteristic as shown in FIG. 6. Specifically, in order to provide a section 63a of a screen mask for printing a thicker Al paste and a section 63b for printing a thinner Al paste, the distance X between a pattern edge 60 and the closest frame 64 of the screen mask is set to 30 mm or less. As this distance X is 30 mm or less, the speed at which the screen mask separates from the back surface of the solar cell by the tension of the screen mask increases when the screen mask is pressurized by a squeegee. Then, the amount of the Al paste passed through the screen mask to be transferred onto the back surface of the solar cell increases and accordingly the thicker Al paste can be printed, as achieved by increasing the speed of movement of the squeegee. With a shorter distance X, a thicker paste can be printed and thus the distance is preferably 20 mm or shorter.

Figure 7A:
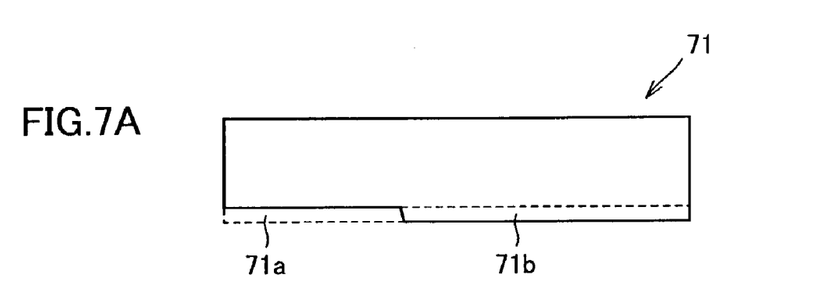
FIG. 7A is a front view of a squeegee and FIG. 7B is a left side view thereof.
Figure 7B:
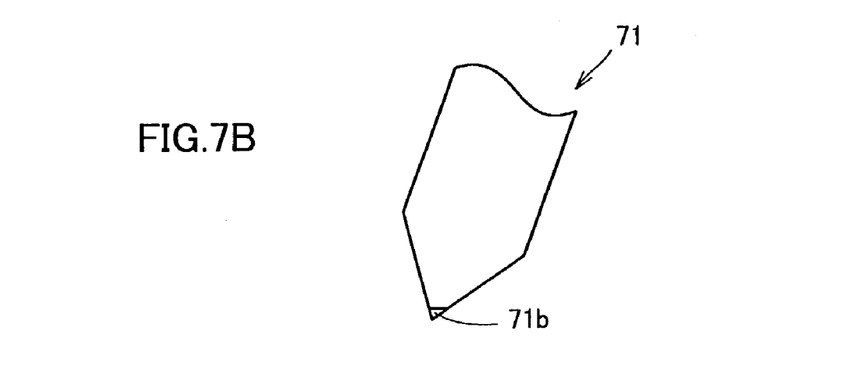
Figure 8A:
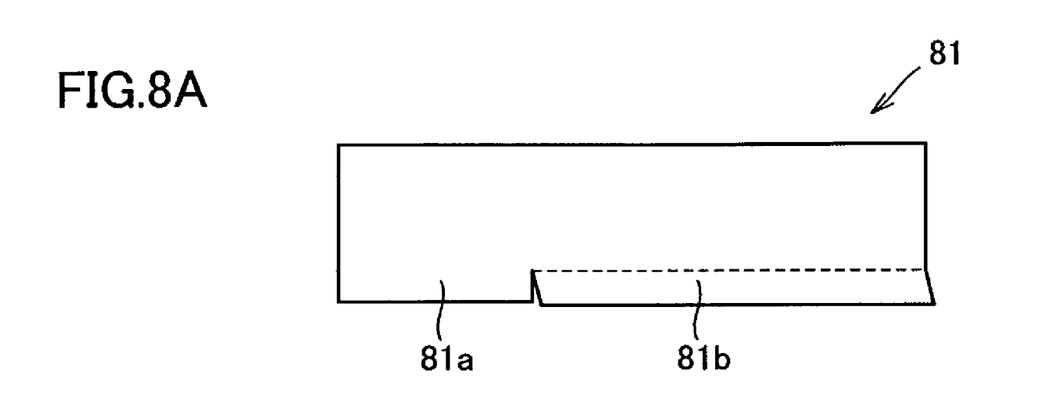
FIG. 8A is a front view of a squeegee and FIG. 8B is a left side view thereof.
Figure 8B:
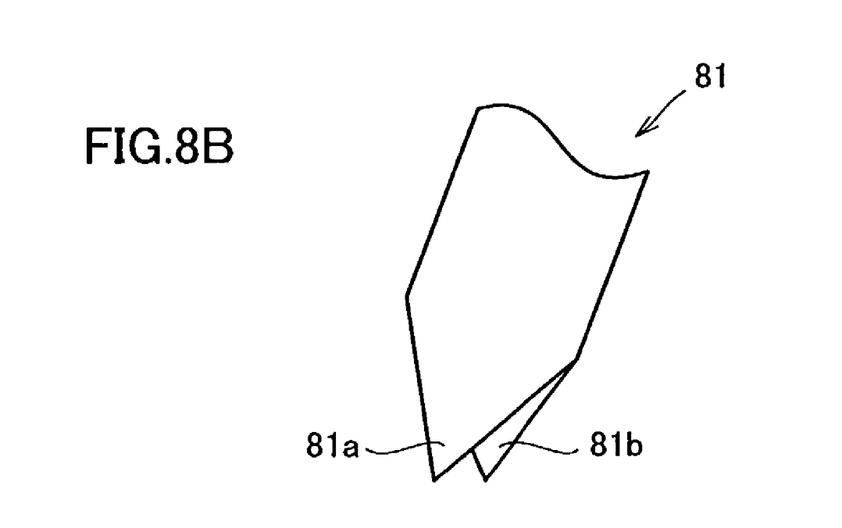

A further example method of manufacturing a solar cell has a characteristic that the pressure of the squeegee in screen printing is different depending on the part to be printed. A lower printing pressure results in a smaller amount of an AL paste which is wiped off and thus results in a thicker printed Al paste. The relation between the printing pressure and the amount of printed Al paste is different depending on the type of the Al paste and the speed of movement of the squeegee, for example. If a printing pressure of 5.0 to 6.0 kg/cm produces an amount of the printed paste of 35 to 40 μm, the printing pressure may be reduced to 2.0 to 2.5 kg/cm to produce the printed paste of 40 to 45 μm. The printing pressure may be varied by the squeegee through the following methods for example. Referring to FIGS. 7A and 7B, a certain part 71a of the edge of a squeegee 71 may be cut off to become shorter than another part 71b of the edge so as to decrease the printing pressure. Alternatively, as shown in FIGS. 8A and 8B, a certain part 81a and another part 81b of the edge of a squeegee 81 may be attached at different angles respectively so as to decrease the printing pressure of the edge part 81a relative to that of the edge part 81b of squeegee 81.

<Manufacturing Apparatus>

A screen printer according to an example embodiment has a characteristic that a stage on which a solar cell is secured is inclined to vary the distance between the screen mask and the back surface of the solar cell according to the part to be printed.

A screen mask according to an example embodiment has a characteristic that a part of the screen mask that is used for printing a thin Al paste is pressed. Further, a screen mask of the example embodiment has a characteristic that the distance between the pattern edge of the screen mask and the closest mask frame is 30 mm or less, and preferably 20 mm or less.

A squeegee according to an example embodiment has a characteristic that a part of the edge of the squeegee is made shorter than another part of the edge in order to decrease the printing pressure of the shorter edge part. Further, a squeegee of the example embodiment has a characteristic that a certain part of the edge of the squeegee and another part thereof are attached at different angles respectively so as to decrease the printing pressure of that certain part relative to the printing pressure of that another part.

The above-described screen printer, screen masks and squeegees are appropriate for an apparatus for manufacturing the solar cell as described above that has the characteristic that at least a part of an outer edge of an Al paste electrode has a greater thickness than that of any remaining part of the electrode.

EXAMPLE 1

A p-type silicon substrate in the shape of a square of 125 mm×125 mm with a thickness of 330 microns was texture-etched. On one side of the substrate, an n-type diffusion layer having a sheet resistance of approximately 50 Ω was formed at 900° C. through thermal diffusion of P. On the diffusion layer, a silicon nitride film with a thickness of approximately 60 nm was formed through plasma CVD so as to serve as an anti-reflection film. Then, on the back surface of the substrate, a paste of Al was screen-printed, dried at 150° C. and put into an IR furnace with the thickest part entering the furnace first. The paste was fired at 700° C. in the air to produce a paste electrode of Al. Moreover, silver pastes were respectively screen-printed on the back side and the light-receiving plane in accordance with a pattern, dried, and thereafter fired at 600° C. for 2 minutes in an oxidizing atmosphere to produce paste electrodes of silver. Finally, the silver paste electrodes were each coated with a solder layer and accordingly, the solar cell was completed.

For the screen printing, a printer SS150 manufactured by Seishin Trading Co., Ltd. was used, and 3718G1 manufactured by MURATA MFG. CO., LTD. was used as the Al paste. Further, as shown in FIG. 2, using screen mask 23 having a thickness of 150 µm and formed of a mesh made of SUS150 and a frame having a size of 320 mm×320 mm, spacer 27 is inserted into one side of frame 24 of the screen mask and secured to mask holder 22, and then printing was done. (Spacers 28 and 29 were not provided in this Example.) Spacer 27 used here was a plastic plate having a width of 15 mm, a length of 150 mm and a thickness of 1 mm. The inserted spacer 27 inclined screen mask 23 with respect to solar cell 25 in lowering a mask holder 22 and screen printing.

The resultant Al paste electrode had a cross section as shown in FIG. 1A, with its thickness successively changing from the thickest part toward the thinnest part. After drying and before firing, the thickest part and the thinnest part of the Al paste had respective thicknesses of 45 µm and 39 µm, with the average thickness of 42 µm. A conventional Al paste is 45 to 55 µm in thickness with the average thereof being approximately 50 µm. Then, the amount of the Al paste used in Example 1 was smaller by 16% as a whole relative to the conventional paste, and thus a thin solar cell was achieved. It is noted that the ball-up did not occur after firing. This example accordingly produced the solar cell having electric characteristics and reliability comparable to those of conventional products, through a simple operation of inserting the spacer, by means of conventional materials and process.

EXAMPLE 2

A solar cell was manufactured as done in Example 1 except that spacer 27 shown in FIG. 2 is removed and spacer 28 made of plastic and having a width of 15 mm, a length of 150 mm and a thickness of 1 mm was attached to stage 26 along one side of cell 25 to perform screen printing.

A resultant Al paste electrode had a cross section as shown in FIG. 1A, with its thickness successively changing from the thickest part toward the thinnest part. After drying and before firing, the thickest part and the thinnest part of the Al paste had respective thicknesses of 45 µm and 40 µm, with the average thickness of 42 µm. Then, the amount of the Al paste used in Example 2 was smaller by 16% as a whole relative to the conventional paste. It is noted that the ball-up did not occur after firing the Al paste. This example accordingly produced the solar cell having electric characteristics and reliability comparable to those of conventional products, through a simple operation of attaching the spacer, by means of conventional materials and process.

EXAMPLE 3

A solar cell was manufactured as done in Example 1 except that, on the top surface of stage 26 shown in FIG. 2, an adhesive cellophane tape 29 of 150 mm in length was affixed, the thickness of the cellophane tape 29 was adjusted to 150 µm, and thereafter cell 25 was fastened thereon to perform screen printing (spacer 27 was removed here).

A resultant Al paste electrode had a cross section as shown in FIG. 1A, with its thickness successively changing from the thickest part toward the thinnest part. After drying and before firing, the thickest part and the thinnest part of the Al paste had respective thicknesses of 46 µm and 40 µm, with the average thickness of 43 µm. Then, the amount of the Al paste used in Example 3 was smaller by 14% as a whole relative to the conventional paste. It is noted that the ball-up did not occur after firing the Al paste. This example accordingly produced the solar cell having electric characteristics and reliability comparable to those of conventional products, through a simple operation of affixing the spacer, by means of conventional materials and process.

EXAMPLE 4

As shown in FIG. 3, a solar cell was manufactured as done in Example 1 except that screen printing was done with squeegee 31 moved at a high speed of 160 mm/sec above the part 38 and moved at a speed of 40 mm/sec equal to that of Example 1 above the remaining part (with spacer 27 removed here).

A resultant Al paste electrode had a cross section as shown in FIG. 1B. After drying and before firing, the thickest part and the thinnest part of the Al paste had respective thicknesses of 45 µm and 41 µm, with the average thickness of 42 µm. Then, the amount of the Al paste used in Example 4 was smaller by 16% as a whole relative to the conventional paste. It is noted that the ball-up did not occur after firing the Al paste. This example accordingly produced the solar cell having electric characteristics and reliability comparable to those of conventional products, through a simple operation of increasing the speed of moving the squeegee, by means of conventional materials and process.

EXAMPLE 5

A solar cell was manufactured as done in Example 1 except that screen printing was done with squeegee 31 moved at a high speed of 160 mm/sec above the parts 38 and 39 and moved at a speed of 40 mm/sec equal to that of Example 1 above the remaining part (with spacer 27 removed here), as shown in FIG. 3.

A resultant Al paste electrode had a cross section with two protruding parts (not shown). After drying and before firing, the thickest part and the thinnest part of the Al paste had respective thicknesses of 45 μm and 41 μm, with the average thickness of 43 μm. Then, the amount of the Al paste used in Example 5 was smaller by 14% as a whole relative to the conventional paste. It is noted that the ball-up did not occur after firing the Al paste. This example accordingly produced the solar cell having electric characteristics and reliability comparable to those of conventional products, through a simple operation of increasing the speed of moving the squeegee, by means of conventional materials and process.

EXAMPLE 6

After Example 1 was carried out, a cell was newly fastened onto the stage. Spacer 27 was removed, scraper 48 was thereafter placed over squeegee 41 as shown in FIG. 4, and then the scale of the printer was adjusted to lower scraper 48 at the position above the part 49 by 0.5 mm relative to other parts so as to start printing. When scraper 48 with squeegee 41 was moved back to scrape the Al paste, scraper 48 at the position above the part 49 is lowered by 0.5 mm to cause the Al paste to be printed on that part 49. Then, as Example 1, squeegee 41 was moved to carry out screen printing.

The part 49 was printed twice. Accordingly, after drying and before firing, the thickest part 49 and the thinnest part of the Al paste had respective thicknesses of 45 μm and 41 μm, with the average thickness of 42 μm. Then, the amount of the Al paste used in Example 6 was smaller by 16% as a whole relative to the conventional paste. It is noted that the ball-up did not occur after firing the Al paste. This example accordingly produced the solar cell having electric characteristics and reliability comparable to those of conventional products, through a simple operation of lowering the scraper by 0.5 mm, by means of conventional materials and process.

EXAMPLE 7

As shown in FIG. 2, a solar cell was manufactured as done in Example 1 except that screws (not shown) for fastening stage 26 were adjusted to lower the left side of stage 26 by 0.5 mm and then secure the stage as it is so as to perform screen printing (without spacer 27).

Accordingly, after drying and before firing, the thickest part and the thinnest part of the Al paste had respective thicknesses of 48 μm and 40 μm, with the average thickness of 42 μm. Then, the amount of the Al paste used in Example 7 was smaller by 16% as a whole relative to the conventional paste. It is noted that the ball-up did not occur after firing the Al paste. This example accordingly produced the solar cell having electric characteristics and reliability comparable to those of conventional products, through a simple operation of changing the angle of placement of the stage, by means of conventional materials and process.

EXAMPLE 8

As shown in FIG. 5, the part of screen mask 53 that corresponds to the region 51 was pressed by a calendar roll. Consequently, the nonpressed part 53b of screen mask 53 was 70 μm in thickness while the pressed part 53a was 59 μm in thickness. A solar cell was manufactured as done in Example 1 except that this screen mask was used to perform screen printing (without spacer 27).

Accordingly, after drying and before firing, the thickest part and the thinnest part of the Al paste had respective thicknesses of 45 μm and 39 μm, with the average thickness of 42 μm. Then, the amount of the Al paste used in Example 8 was smaller by 16% as a whole relative to the conventional paste. It is noted that the ball-up did not occur after firing the Al paste. This example accordingly produced the solar cell having electric characteristics and reliability comparable to those of conventional products, through a simple operation of pressing the screen mask, by means of conventional materials and process.

EXAMPLE 9

As shown in FIG. 6, in order to produce the part 63a and the part 63b of screen mask 63 respectively for printing the Al paste to larger and smaller thicknesses, the distance X between the pattern edge 60 and the closest frame 64 of the screen mask was adjusted to 20 mm. In addition, since frame 64 was of small size, an adapter (not shown) was used for printing. A solar cell was then manufactured as done in Example 1 except for the above-discussed procedure (without spacer 27).

After drying and before firing, the thickest part and the thinnest part of the Al paste had respective thicknesses of 45 μm and 42 μm, with the average thickness of 43 μm. Then, the amount of the Al paste used in Example 9 was smaller by 14% as a whole relative to the conventional paste. It is noted that the ball-up did not occur after firing the Al paste. This example accordingly produced the solar cell having electric characteristics and reliability comparable to those of conventional products, through a simple operation of changing the specification of the screen mask, by means of conventional materials and process.

EXAMPLE 10

A solar cell was manufactured as done in Example 1 except that an Al paste was uniformly screen-printed on the entire back surface of the p-type silicon substrate to a thickness, after being dried, of 36 μm, the paste was then dried, and one side corresponding to the outer edge of the resultant Al paste electrode was subjected to screen printing again (without spacer 27).

The resultant Al paste electrode had a cross section as shown in FIG. 1C. The thickest part and the thinnest part of the Al paste had respective thicknesses of 55 μm and 36 μm, with the average thickness of 40 μm. Then, the amount of the Al paste used in Example 10 was smaller by 20% as a whole relative to the conventional paste. It is noted that the ball-up did not occur after firing the Al paste. This example accordingly produced the solar cell having electric characteristics and reliability comparable to those of conventional products, through a simple operation of performing screen printing twice, by means of conventional materials and process.

EXAMPLE 11

A solar cell was manufactured as done in Example 1 except that an Al paste was uniformly screen-printed on the entire back surface of the p-type silicon substrate to a thickness, after being dried, of 36 μm, the paste was then dried, and two opposing sides corresponding to the outer edge of the resultant Al paste electrode were subjected to screen printing again (without spacer 27).

The resultant Al paste electrode had a cross section as shown in FIG. 1D. The thickest part and the thinnest part of the Al paste had respective thicknesses of 55 μm and 36 μm, with the average thickness of 41 μm. Then, the amount of the Al paste used in Example 11 was smaller by 18% as a whole relative to the conventional paste. It is noted that the ball-up did not occur after firing the Al paste. This example accordingly produced the solar cell having electric characteristics and reliability comparable to those of conventional products, through a simple operation of performing screen printing twice, by means of conventional materials and process.

EXAMPLE 12

An Al paste was uniformly screen-printed on the entire back surface of the p-type silicon substrate to a thickness, after being dried, of 36 μm, the paste was then dried, and one side was spray-coated, that one side being a place where the outer edge of the resultant Al paste electrode was to be located. For the spray coating, 20% by mass of n-butyl carbitol acetate was added to the Al paste which was used for the screen printing in order to decrease the viscosity of the paste. An air gun was used for the spray coating to form a spray coating of 20 mm in width. A solar cell was accordingly produced as done in Example 1 except for the above-described process (no spacer 27 was attached).

The resultant Al paste electrode had a cross section as shown in FIG. 1C. The thickest part and the thinnest part of the Al paste had respective thicknesses of 53 μm and 36 μm, with the average thickness of 40 μm. Then, the amount of the Al paste used in Example 12 was smaller by 20% as a whole relative to the conventional paste. It is noted that the ball-up did not occur after firing the Al paste. This example accordingly produced the solar cell having electric characteristics and reliability comparable to those of conventional products, through a simple operation of adding one spray coating process, by means of conventional materials and process.

EXAMPLE 13

An Al paste was uniformly screen-printed on the entire back surface of the p-type silicon substrate to a thickness, after being dried, of 36 μm, the paste was then dried, and four sides were spray-coated, that four sides being a place where the outer edge of the resultant Al paste electrode was to be located. For the spray coating, the Al paste (diluted) used in Example 12 was employed. An air gun was used for the spray coating to form a spray coating of 20 mm in width. A solar cell was accordingly produced as done in Example 1 except for the above-described process (no spacer 27 was attached).

The resultant Al paste electrode had a cross section as shown in FIG. 1E. The thickest part and the thinnest part of the Al paste had respective thicknesses of 53 μm and 36 μm, with the average thickness of 42 μm. Then, the amount of the Al paste used in Example 13 was smaller by 16% as a whole relative to the conventional paste. It is noted that the ball-up did not occur after firing the Al paste. This example accordingly produced the solar cell having electric characteristics and reliability comparable to those of conventional products, through a simple operation of adding one spray coating process, by means of conventional materials and process.

EXAMPLE 14

As shown in FIG. 7A, a certain part 71a of the edge of squeegee 71 that is a side contacting the screen mask was cut off over 100 μm and 20 mm in width. FIG. 7B shows a left side of this squeegee 71. A solar cell was accordingly produced as done in Example 1 except for the use of the squeegee (no spacer 27 was attached).

The thickest part and the thinnest part of the Al paste had respective thicknesses of 45 μm and 41 μm, with the average thickness of 42 μm. Then, the amount of the Al paste used in Example 14 was smaller by 16% as a whole relative to the conventional paste. It is noted that the ball-up did not occur after firing the Al paste. This example accordingly produced the solar cell having electric characteristics and reliability comparable to those of conventional products, through a simple operation of cutting off the edge of the squeegee, by means of conventional materials and process.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A solar cell comprising a silicon substrate having a fired Al paste electrode and silver paste electrodes on a solar cell back surface, at least a part of an outer edge of said fired Al paste electrode having a greater thickness than that of any remaining part of said fired Al paste electrode, and said part of the outer edge of said fired Al paste electrode having a greater thickness being formed of a thicker Al paste, wherein said fired Al paste electrode is directly formed on a back surface of said silicon substrate, the remaining part of said Al paste electrode on average being less than 45 microns, the greater thickness being chosen to avoid ball-up during heat treatment of Al particles on the outer edge of the Al paste electrode.

2. The solar cell according to claim 1, wherein only one side of the outer edge of said fired Al paste electrode is thicker than any remaining part of said fired Al paste electrode.

3. The solar cell according to claim 1, wherein only two sides opposite to each other of the outer edge of said fired Al paste electrode are thicker than any remaining part of said fired Al paste electrode.

4. The solar cell according to claim 1, wherein only two sides adjacent to each other of the outer edge of said fired Al paste electrode are thicker than any remaining part of said fired Al paste electrode.

5. The solar cell according to claim 1, wherein the thickness of said fired Al paste electrode successively changes.

6. A solar cell comprising a silicon substrate having a fired Al paste electrode and silver paste electrodes on a solar cell back surface, at least a part of an outer edge of said fired Al paste electrode having a greater thickness than that of any remaining part of said fired Al paste electrode due to a thicker application of fired Al paste at the at least a part of the outer edge, wherein said fired Al paste electrode is directly formed on a back surface of said silicon substrate, the remaining part of said Al paste electrode on average being less than 45 microns, the greater thickness being chosen to avoid ball-up during heat treatment of Al particles on the outer edge of the Al paste electrode.

7. A solar cell made by a process of applying a fired Al paste electrode and silver paste electrodes on a back surface of a solar cell formed in a silicon substrate whereby at least a part of an outer edge of said fired Al paste electrode has a greater thickness than any remaining part of said fired Al paste electrode due to a thicker application of Al paste at the at least a part of the outer edge and said fired Al paste electrode is directly formed on the back surface of said silicon substrate, the remaining part of said Al paste electrode on average being less than 45 microns, the greater thickness being chosen to avoid ball-up during heat treatment of Al particles on the outer edge of the Al paste electrode.

8. A solar cell comprising:
   a silicon substrate;
   an Al paste electrode formed on a solar cell back surface by heat treatment of Al paste applied on the back surface of the silicon substrate, at least a part of an outer edge of said Al paste electrode having a greater thickness than any remaining part of said Al paste electrode, the remaining part of said Al paste electrode on average being less than 45 microns, the greater thickness being chosen to avoid ball-up during heat treatment of Al particles on the outer edge of the Al paste electrode.

* * * * *